United States Patent [19]

Davis et al.

[11] Patent Number: 4,942,358
[45] Date of Patent: Jul. 17, 1990

[54] INTEGRATED CIRCUIT OPTION IDENTIFICATION CIRCUIT AND METHOD

[75] Inventors: Gregory A. Davis; Harold L. Spangler, both of Chandler, Ariz.

[73] Assignee: Motorola, Inc., Schaumburg, Ill.

[21] Appl. No.: 266,446

[22] Filed: Nov. 2, 1988

[51] Int. Cl.$^5$ .................. G06F 11/22; G01R 27/02
[52] U.S. Cl. .................. 324/158 R; 324/73.1; 324/158 T
[58] Field of Search ............ 324/158 R, 73 R, 73 AT, 324/73 PC, 158 D, 158 T; 307/455, 456, 561; 371/20, 15

[56] References Cited

U.S. PATENT DOCUMENTS

| | | | |
|---|---|---|---|
| 3,731,206 | 5/1973 | Veale | 307/561 |
| 4,301,403 | 11/1981 | Hawkes et al. | 324/158 D |
| 4,380,070 | 4/1983 | Steiner | 371/20 |
| 4,410,816 | 10/1983 | Kanai | 324/73 R |
| 4,468,612 | 8/1984 | Starr | 324/73 PC |

Primary Examiner—Reinhard J. Eisenzopf
Assistant Examiner—Vinh P. Nguyen
Attorney, Agent, or Firm—Michael D. Bingham

[57] ABSTRACT

An identification circuit for use in identifying at least two integrated circuits having the same logic function but different input/output characteristics, each circuit having first and second isolated power supply conductors. A unilateral current conducting circuit having an input and an output is coupled between the first and second power supply conductors via conductive jumpers in all but one of the identifiable integrated circuits. The conductive jumpers are removed for one integrated circuit family. The other integrated circuit families have unique combinations of a resistor and at least one serially coupled diode wherein a predetermined potential is required to induce current to flow therethrough for each family. The potential of the first power supply conductor is increased in predetermined steps until current flow is detected, or a predetermined maximum potential is reached. The combination of the presence of absence of current flow and the potential at the first power supply conductor associated therewith provide the identification of the integrated circuit.

5 Claims, 1 Drawing Sheet

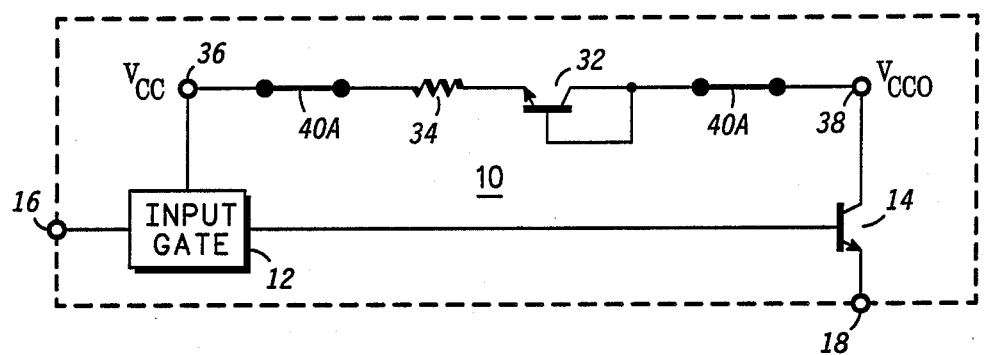
FIG. 1
FIG. 2
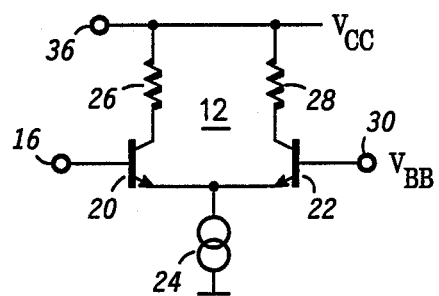

INTEGRATED CIRCUIT OPTION IDENTIFICATION CIRCUIT AND METHOD

BACKGROUND OF THE INVENTION

The present invention relates to integrated logic circuits and, more particularly, to a circuit and method for providing electrical identification of different families of such circuits having identical functionality but different input/output behavior without the need for requiring extensive testing at the manufacturing process level.

Semiconductor manufacturers of standard logic integrated circuits often provide two or more families or versions of circuits having the same logic functions but different input/output characteristics. An example of the foregoing are the 10E and 100E Emitter-Coupled-Logic (ECL) families manufactured by Motorola, Inc. The 10E and 100E family of products provide the same logic functions but have different biasing requirements and output characteristics with temperature. Moreover, each particular logic circuit of each family is produced from the same mask set such that it is impossible to tell which family to which the logic circuit belongs without testing.

Since the functionality of the two families of logic circuits are the same it is necessary to provide some means at the manufacturing and test level to identify to which a family the ECL circuit belongs. This is needed to prevent substitution of an ECL circuit from one family with that of another logic family by mistake.

SUMMARY OF THE INVENTION

Accordingly, it is an object of the present invention to provide a method for identifying different families of logic circuits having the same functionality but different input/output characteristics from one another.

It is another object of the invention to provide an integrated circuit option identification circuit.

In accordance with the above and other objects there is provided an identification circuit for use in identifying at least two integrated circuits having the same logic function but different input/output characteristics, each circuit having first and second isolated power supply conductors, which comprises circuitry having an input and an output for unilaterally conducting current between the input and output thereof; and conductive means which is provided only in one of the two circuits and not in the other for coupling the input and output of the circuitry respectively to the first and second power supply conductors wherein current flows in the circuitry as the first power supply conductor is raised to a higher potential with respect to the second power supply conductor during test of the integrated circuits.

The above and other objects, features, and advantages of the present invention will be better understood from the following detailed description taken in conjunction with the accompanying drawings.

BRIEF DESCRIPTION OF THE DRAWINGS

FIG. 1 is a schematic diagram illustrating a standard ECL circuit including the identification circuit of the present invention; and FIG. 2 is a schematic diagram illustrating a typical input gate of a standard ECL circuit.

DETAILED DESCRIPTION OF THE INVENTION

Turning now to the Figures there is shown within the dashed box a standard ECL integrated circuit which includes identification circuit 10 of the preferred embodiment. The ECL circuit typically includes an input gate 12 having an output coupled to the output driver stage comprising NPN transistor 14 and an input coupled to terminal 16. FIG. 2 illustrates a conventional input gate 12 which includes emitter coupled NPN transistors 20 and 22. The base of transistor 20 is coupled to input 16 to receive a logic input signal while its emitter is coupled to a current supply 24 and its collector is coupled via resistor 26 to a power supply conductor at which is provided a source of operating potential $V_{CC}$. Transistor 22 also has its emitter coupled to current supply 24 and its collector coupled to $V_{CC}$ via resistor 28 while its base is coupled to a bias potential $V_{BB}$ at terminal 30. The output of input gate 12 may, for instance, be taken at the collector of transistor 22 and be coupled to the base of transistor 14, the latter having its collector-emitter conduction path coupled between $V_{CCO}$ and the output of the ECL circuit at terminals 38 and 18 respectively. Hence, in operation, in response to a logic input signal at terminal 16, a logic output signal will be produced at output 18 as transistor 14 is driven between high and low operating states as is well known. Although input gate 12 is shown as having only a single input transistor 20 having its emitter coupled to the emitter of transistor 22 it is understood that any number of input transistors can be provided which would, for example, have their respective collectors and emitters coupled in parallel to the collector and emitter of transistor 20 and their bases coupled to respective input terminals of the ECL circuit in order to provide desired logic circuit functions.

As previously discussed, different logic families can be manufactured having the same logic functionallity but different behavior characteristics. In this case, the logic circuit, as shown in FIG. 1, may be functionally equivalent for each family. Typically, the ECL circuits have first and second isolated power supply conductors 36 and 38 to which equal operating potentials $V_{CC}$ and $V_{CCO}$ are supplied during operation of the ECL logic circuit. Generally, the semiconductor manufactured has had problems in determining to which family the ECL circuit belongs after packaging and at the test level prior to shipment of the circuits to customers.

Circuit 10 of the present invention provides a method for identifying two versions of the same logic function ECL circuit from one another. In each version circuit 10 would be formed in the integrated circuit during process of the circuit. Option identification circuit 10 includes at least one diode connected transistor 32 and resistor 34. The latter of which is coupled in series with the collector-emitter conduction path of the transistor. Circuit 10, although being present in each version of the logic family of logic circuits is coupled to power supply conductors 36 and 38 in only one of the versions or logic families. Circuit 10 is coupled to conductors 36 and 38 through a pair of metal mask options 40A connecting resistor 34 to terminal 36 and the collector of transistor 32 to terminal 38. Thus, in the process step of making the integrated circuit metal links are formed on the integrated circuit for operationally connecting circuit 10 between terminals 36 and 38 only for those logic circuits of one logic family and not for those logic circuits of the other logic family.

The identification of the integrated circuit families requires the generation of a predetermined potential at terminal 38 and the sensing of the current flowing through identification circuit 10 both of which may be provided via an external test set featuring voltage generating circuity and current sensing circuity. During the testing phase, terminals 38 and 36 may be coupled to the first and second terminals the test set, respectively. In a first circuit family, wherein metal jumpers 40A are installed, the test set develops a predetermined potential at terminal 38 sufficient to turn on transistor 32 and allow current to flow into the second terminal of the test set permitting the current sensing circuitry to detect the presence of current flow. In a second circuit family without metal jumpers 40A, the application of the predetermined potential at terminal 38 cannot induce current to flow through identification circuit 10 due to the open circuit configuration. The current sensing circuitry of the test set then detects the absence of current flow. Thus, the presence or absence of current flowing through identification circuit 10 as monitored by the test set determines the identification of the first and second IC families.

Hence, circuit 10 provides a method for identifying to which family the ECL circuit belongs during manufacturing test at the wafer die stage as well as at final testing stages. If the voltage level at terminal 38 is raised above the voltage level at terminal 36 by $V_{BE}$, current will be unilaterally conducted therebetween which can be detected to indicated which logic family the ECL circuit belongs to. It is noted that during normal operation of the logic circuits that $V_{CC}$ and $V_{CCO}$ are at the same potential, typically ground reference.

Although transistor 32 is shown as a collector-base shorted NPN diode, it is realized that any type of diode may be used as, for example, a PN or poly diode.

Hence, what has been described above is a novel option identification circuit and method for identifying different families of logic circuits having the same logic functionallity from one another. By using a metal mask option during wafer processing the circuit is coupled between first and second power supply conductors in only those logic circuits of one family and not in the other. During manufacturer testing one of the power supply conductors is raise to a higher potential than the other to produce unilateral current flow through the identification circuit which is connected therebetween by the metal option.

I claim:

1. A method for identifying at least two versions of integrated circuits each having the same functionality wherein the integrated circuits include two electrically isolated power supply conductors that are at substantially equal potential during normal operation of the integrated circuits, comprising the steps of:
   disposing unilaterally current conducting circuit means in the respective versions of integrated circuits;
   conductively coupling said conducting means between the two power supply conductors in all but one version of the integrated circuits;
   raising the voltage potential at one of the two power supply conductors with respect to the other wherein current flows through said conducting means therebetween; and
   detecting said current flow through said conducting circuit means.

2. An integrated logic circuit, comprising:
   first and second electrically isolated power supply conductors, said first and second power supply conductors receiving substantially equal voltage potentials during normal operating condition;
   circuit means for unilaterally sourcing current between an input and an output thereof whenever said input is at a higher potential than said output; and
   removeable conductive means for coupling said input and output of said circuit means to said first and second power supply conductors respectively, wherein current flows between said first and second power supply conductors when said first power supply conductor is raised to a higher voltage potential than said second power supply conductor.

3. The integrated circuit of claim 2 wherein said circuit means includes diode means and resistive means series coupled between said input and output of said circuit means.

4. In the production of first and second integrated circuit families of products wherein particular circuits of each of the first and second family of circuits have identical functionallity but different behavior characteristics, a circuit for identifying during test the circuit of the first circuit family from a circuit of the second circuit family each of which have the same functionallity, each of the circuits including first and second electrically isolated power supply conductors that are supplied substantially equal voltage potentials during normal operation of the circuit, said circuit for identifying comprising:
   circuit means disposed in the first and second integrated circuit families and having an input and an output for unilaterally conducting current whenever said input is at a higher potential than said output;
   conducting means for coupling said input and output of said circuit means of only the circuits of the first integrated circuit family to said first and second power supply conductors wherein current flows between said first and second power supply conductors when said first power supply conductor is raised to a higher voltage potential than said second power supply conductor during test of the integrated circuit families.

5. The identifying circuit of claim 4 wherein said circuit means includes at least one diode and one resistor series coupled between said input and output of said circuit means.

* * * * *